(12) United States Patent
Rosen et al.

(10) Patent No.: US 10,586,908 B2
(45) Date of Patent: Mar. 10, 2020

(54) QUANTUM COHERENT DEVICES WITH REDUCED ENERGY DISSIPATION

(71) Applicant: Lawrence Livermore National Security, LLC, Livermore, CA (US)

(72) Inventors: Yaniv Rosen, Livermore, CA (US); Jonathan Dubois, Livermore, CA (US); Eric Thomas Holland, Livermore, CA (US); Matthew A. Horsley, Danville, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 21 days.

(21) Appl. No.: 16/038,096

(22) Filed: Jul. 17, 2018

(65) Prior Publication Data

US 2020/0028062 A1 Jan. 23, 2020

(51) Int. Cl.
| | | |
|---|---|---|
| *H01L 39/02* | (2006.01) | |
| *H01L 39/22* | (2006.01) | |
| *H01L 27/18* | (2006.01) | |
| *H01L 39/24* | (2006.01) | |
| *G06N 10/00* | (2019.01) | |

(52) U.S. Cl.
CPC ........... *H01L 39/025* (2013.01); *G06N 10/00* (2019.01); *H01L 27/18* (2013.01); *H01L 39/223* (2013.01); *H01L 39/2493* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,988,058 B1* | 1/2006 | Sherwin | ................. | B82Y 10/00 703/1 |
| 8,094,023 B1 | 1/2012 | El-Kady et al. | | |
| 2002/0079485 A1* | 6/2002 | Stintz | ..................... | B82Y 10/00 257/14 |
| 2009/0321719 A1* | 12/2009 | Folman | .................. | G06N 10/00 257/25 |
| 2011/0277829 A1* | 11/2011 | Fafard | .................... | B82Y 10/00 136/255 |
| 2013/0255738 A1 | 10/2013 | Mitrovic et al. | | |
| 2013/0256504 A1* | 10/2013 | Stevenson | ............. | G02F 1/2257 250/201.1 |

(Continued)

OTHER PUBLICATIONS

Agarwal, K., et al. "Polaronic model of two-level systems in amorphous solids", Physical Review B 87, 144201, Apr. 2013, 14 pages.

(Continued)

*Primary Examiner* — Mamadou L Diallo
(74) *Attorney, Agent, or Firm* — Perkins Coie LLP

(57) ABSTRACT

The disclosed technology can be used to increase lifetimes of quantum coherent devices such as qubits including transmons and xmons and to reduce the losses in resonators. Energy stored in superconducting devices can be lost by emission of phonons that couple to the environment. Defects in one or more materials in the quantum coherent device can cause the coupling to phonons. Patterning one or more of the layers creates a phononic bandgap that reduces or eliminates the emission of the phonons to the environment. The energy then couples back to the quantum coherent device.

22 Claims, 9 Drawing Sheets

(56) References Cited

U.S. PATENT DOCUMENTS

| | | | | |
|---|---|---|---|---|
| 2014/0326902 | A1* | 11/2014 | Tahan | H01L 49/006 250/493.1 |
| 2015/0333840 | A1* | 11/2015 | Bennett | H01S 5/041 398/65 |
| 2016/0079968 | A1 | 3/2016 | Strand et al. | |
| 2016/0261091 | A1* | 9/2016 | Santis | G02B 6/00 |
| 2017/0167977 | A1* | 6/2017 | Rivera | G01N 21/636 |
| 2017/0199036 | A1* | 7/2017 | Moxley, III | G01R 33/0354 |
| 2018/0090200 | A1* | 3/2018 | Soykal | G11C 11/44 |
| 2018/0107938 | A1* | 4/2018 | Morello | G01N 24/10 |
| 2019/0019098 | A1* | 1/2019 | Przybysz | G06N 10/00 |

OTHER PUBLICATIONS

Bruno, A. et al., "Reducing intrinsic loss in superconducting resonators by surface treatment and deep etching of silicon substrates," Appl. Phys. Lett., vol. 106, No. 18, p. 182601, May 2015.

Chu, Y. et al., "Suspending superconducting qubits by silicon micromachining," Apple. Phys. Lett., vol. 109, No. 11, p. 112601, 2016.

Garraway, B. et al., "Decay of an atom coupled strongly to a reservoir," Phys. Rev. A, vol. 55, No. 6, pp. 4636-4639, Jun. 1997.

Geerlings, K. et al., "Improving the quality factor of microwave compact resonators by optimizing their geometrical parameters," Appl. Phys. Lett., vol. 100, No. 19, p. 192601, May 2012.

Houck, A. et al, Controlling the Spontaneous Emission of a Superconducting Transmon Qubit, Phys. Rev. Lett., vol. 101, No. 8, p. 80502, Aug. 2008.

Johnson, S. et al., "Three-dimensionally periodic dielectric layered structure with omnidirectional photonic band gap," Appl. Phys. Lett., vol. 77, No. 22, p. 3490, 2000.

Kitano, K. et al., "Three-dimensional photonic crystals fabricated by simultaneous multidirectional etching," Phys. Rev. B, vol. 91, No. 15, p. 155308, 2015.

Koch, J. et al., "Charge-insensitive qubit design derived from the Cooper pair box," Phys. Rev. A, vol. 76, No. 4, p. 42319, Oct. 2007.

Kumar, P. et al., "Origin and Reduction of 1/f Magnetic Flux Noise in Superconducting Devices," Phys. Rev. Appl., vol. 6, No. 4, p. 41001, Oct. 2016.

Mayer Alegre, T. et al., "Full Phononic Bandgap in 2D-Optomechanical Crystals," in CLEO:2011—Laser Applications to Photonic Applications, 2011, vol. 1, No. d, p. CFA1.

Megrant, A. et al., "Planar superconducting resonators with internal quality factors above one million," Appl. Phys. Lett., vol. 100, No. 11, p. 113510, Mar. 2012.

Olsson III, R. et al., "Microfabricated phononic crystal devices and applications," Meas. Sci. Technol., vol. 20, No. 1, pp. 12002, 2009.

Paik, H. et al., "Observation of High Coherence in Josephson Junction Qubits Measured in a Three-Dimensional Circuit QED Architecture," Phys. Rev. Lett., vol. 107, No. 24, p. 240501, 2011.

Pop, I. et al. "Coherent suppression of electromagnetic dissipation due to superconducting quasiparticles," Nature, vol. 508, No. 7496, pp. 369-372, Apr. 2014.

Profunser, D. et al., "Dynamic visualization of surface acoustic waves on a two-dimensional phononic crystal," Phys. Rev. B, vol. 80, No. 1, p. 14301, Jul. 2009.

Richardson, C. et al., "Fabrication artifacts and parallel loss channels in metamorphic epitaxial aluminum superconducting resonators," Supercond. Sci. Technol., vol. 29, No. 6, p. 64003, Jun. 2016.

Safavi-Naeini, A. et al., "Design of optomechanical cavities and waveguides on a simultaneous bandgap phononic-photonic crystal slab," Opt Express, vol. 18, No. 18, pp. 14926-14943, 2010.

Safavi-Naeini, A. et al., "Two-Dimensional Phononic-Photonic Band Gap Optomechanical Crystal Cavity," Phys. Rev. Lett., vol. 112, No. 5, p. 153603, Apr. 2014.

Sandberg, M. et al., "Etch induced microwave losses in titanium nitride superconducting resonators," Appl. Phys. Lett., vol. 100, No. 26, p. 262605, 2012.

Schreier, J. et al., "Suppressing charge noise decoherence in superconducting charge qubits," Phys. Rev. B, vol. 77, No. 18, p. 180502, May 2008.

Wang, C. et al., "Measurement and control of quasiparticle dynamics in a superconducting qubit," Nat. Commun., vol. 5, p. 5836, Dec. 2014.

Henriques, F., "Design and fabrication of phonon traps to reduce the density of quasiparticles in superconducting quantum circuits", Faculty of Science and Technology, University of Coimbra, Sep. 2018, 57 pages, Portugal.

* cited by examiner

QUANTUM COHERENT DEVICES WITH REDUCED ENERGY DISSIPATION

FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

The present disclosure relates to quantum coherent devices.

BACKGROUND

Superconducting circuits can be used in a variety of low energy technologies. For example, superconducting circuits can be constructed based on superconducting elements that exhibit quantum bits ("qubits") such as certain circuits using the non-linear inductance of a Josephson junction to create atomic-like energy levels to perform quantum mechanical operations.

SUMMARY

The disclosed technology can be used to increase lifetimes of quantum coherent devices exhibiting quantum states such as qubits which include, for example, transmons and xmons. Energy stored in superconducting devices can be lost by various ways, e.g., emission of phonons, that transfer the energy to the environment. The disclosed technology can be implemented to mitigate undesired energy loss to the environment because this energy loss can cause decoherence, noise, and loss of fidelity for the quantum coherent devices. Different from some approaches to minimizing the loss that involve increasing the size of features to reduce the electric field participation in the regions of the defects (surfaces and interfaces), the disclosed technology in this patent document can be used to reduce the energy loss in devices exhibiting quantum states in form of various superconducting structures such as transmon structures based on transmission line shunted plasma oscillation qubits (originally developed at Yale University), xmon structures using cross-shapes in a linear array (originally developed at University of California, Santa Barbara), and others. Defects in one or more materials in the quantum coherent device can cause the coupling to the environment via phonons. Patterning one or more of the layers creates a phononic bandgap that reduces or eliminates the coupling to the environment due to the defects. With the phononic bandgap, the defects primarily couple back to the quantum coherent device.

In one aspect, the disclosed technology can be implemented to provide a quantum coherent apparatus comprising one or more superconducting devices structured to exhibit different quantum states for quantum computing. Each superconducting device includes a plurality of layers including a patterned layer structured to exhibit a phononic bandgap and a dielectric layer coupled to the patterned layer. A defect in the plurality of layers may cause a coupling of energy away from the quantum coherent apparatus via phonons but the phononic bandgap reduces the one-way coupling of energy via the phonons to the environment thereby increasing a lifetime of the quantum coherent device.

In another aspect, the disclosed technology can be implemented to provide a quantum coherent device that includes one or more superconducting devices and a plurality of layers. The layers include a patterned layer coupled to the one or more superconducting devices, wherein the patterned layer causes a phononic bandgap; and a dielectric layer coupled to the one or more superconducting devices, wherein defects in one or more of the plurality of layers causes a one-way coupling of energy away from the quantum coherent apparatus via phonons. The phononic bandgap increases a lifetime of the quantum coherent device by reducing the one-way coupling of energy via the phonons.

The following features may be included in any combination. The patterned layer causes forbidden phonon energy states corresponding to a predetermined frequency to reduce the one-way coupling of energy via the phonons. The one or more superconducting devices are patterned to reduce the one-way coupling of energy via the phonons. The patterned layer is the dielectric layer. The patterned layer is a substrate layer. The patterned layer is a ground plane layer. The one or more superconducting devices comprise two superconducting devices. The two superconducting devices are connected together via a Josephson junction. The dielectric layer includes the defects. A surface on the superconducting devices, a surface of the substrate, or a surface of a metal layer includes the defects. The energy from the phonons is coupled back to the one or more superconducting devices. The quantum coherent apparatus is configured as a resonator. The patterned layer is patterned according to a repeating geometric shape. The repeating geometric shape is a star. The repeating geometric shape is a cross. The repeating geometric shape has a size between 200 nanometers and 5 microns. The quantum coherent apparatus is configured as a qubit such as a transmon or an xmon.

In yet another aspect, the disclosed technology can be implemented to provide a method of extending the lifetime of a quantum coherent device is disclosed. The method includes storing at least one quantum bit of information in one or more superconducting devices; and prohibiting a band of phonon emission energies by patterning a layer of material to create a phononic bandgap, wherein defects in another layer cause a one-way coupling of energy away from the quantum coherent device via phonons, and wherein the phononic bandgap increases a lifetime of the quantum coherent device by reducing the one-way coupling of energy via the phonons.

The following features may be included in any combination. The layer includes one or more of a dielectric layer, a substrate layer, and a ground plane layer. The other layer includes one or more of a dielectric layer, a substrate layer, and a metal plane layer, and wherein the defects at the metal layer are on a surface. The one or more superconducting devices comprise two superconducting devices, and wherein the two superconducting devices are connected together via a Josephson junction. The quantum coherent device is configured as a resonator. The patterned layer is patterned according to a repeating geometric shape.

BRIEF DESCRIPTION OF THE DRAWINGS

The diagram of FIG. 1 depicts an example of a quantum coherent device including a resonant wave or particle confined to a space such as in a cavity with reflective ends, in accordance with some example embodiments.

DETAILED DESCRIPTION

The disclosed technology can be implemented to provide circuits with extended element lifetimes by integrating superconducting quantum bits (qubits) or other superconducting devices with phononic bandgap structures. Normally, a qubit decays with the emission of a phonon at the qubit frequency. A phononic bandgap constructed around that frequency suppresses the emission of phonons. In some example embodiments, an order of magnitude improvement in lifetimes may be achievable by introducing a bandgap in the phonon density of states. Some examples of such bandgap structures that integrate with a transmon qubit and other quantum coherent devices are provided below.

A challenge of qubit fabrication lies in the design of structures and processes that remove or ameliorate uncontrolled coupling to the environment. Examples of efforts to date in superconducting systems include: optimizing device parameters and operation to reduce sensitivity to known sources of coupling e.g. the transmon regime of the charge qubit, elimination of spurious resonances and radiative coupling via Purcell filtering, deep substrate etching, undercuts and geometry optimization to reduce participation with lossy dielectrics and surface defects, introduction of quasiparticle traps, improvements in interface quality, surface processing and vacuum hygiene to reduce the concentration of adsorbates and/or the density of surface and interfacial defects, and others. In various implementations of these efforts, dissipative processes (i.e. those which result in energy transfer from the qubit to the environment) tend to remain the dominant source of noise in superconducting qubits. The disclosed technology in this patent document can be used for addressing one of the primary mechanisms of transporting energy to the environment-coupling to the phonon bath.

In various superconducting qubit circuits, superconducting qubits usually do not couple directly to phonons. However, many potentially dissipative processes including interaction of the qubit with surface and bulk defects, lossy dielectrics, and resistive losses associated with nonequilibrium quasiparticles, ultimately rely on phonons to irreversibly carry energy from the system to the environment. Compared to the phonon bath, defect states, and unpaired electrons, have a relatively sparse density of states. Dissipation canonically occurs when energy is transferred to the phonon bath resulting in an increase of entropy.

Figure 1:
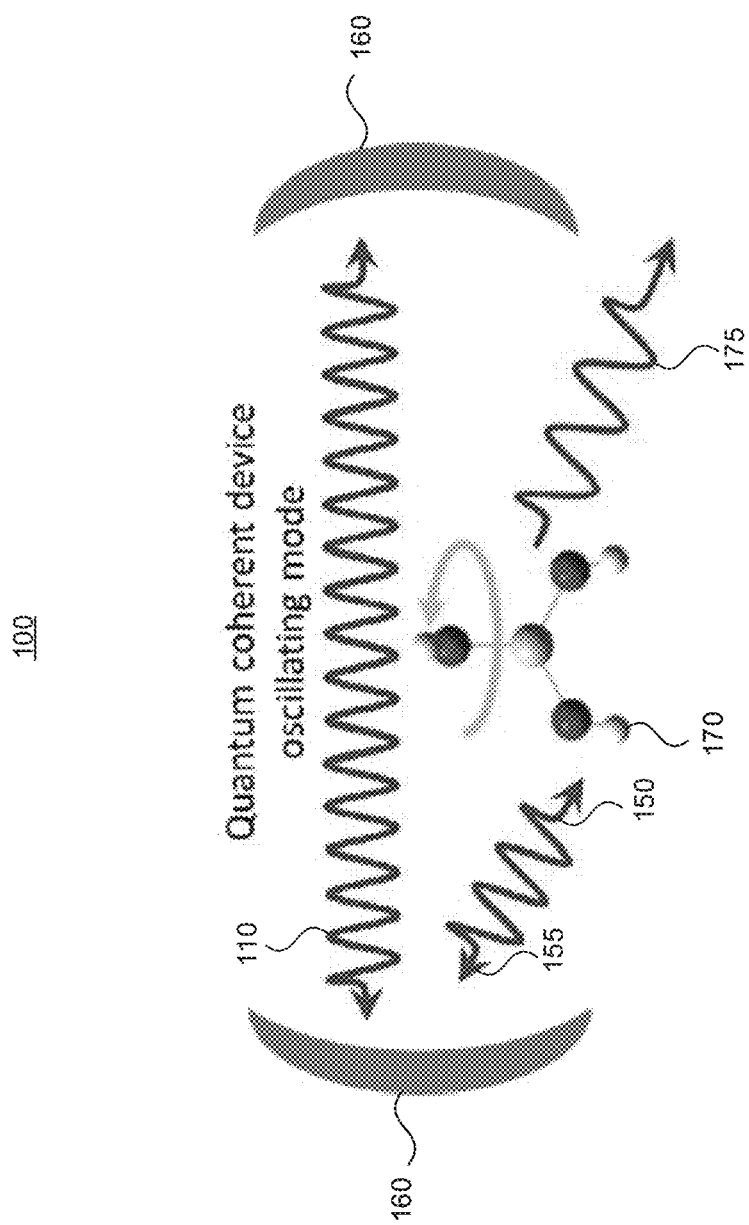

FIG. 1 shows a diagrammatic representation of how energy stored in a qubit can be lost to phonons. To reduce this loss channel via phonon emission, disclosed are circuits exhibiting qubits with an integrated phononic bandgap structure. In some implementations, a phononic bandgap (PB) structure can include a meta-material composed of repeating unit cells designed to block propagation of certain vibrational modes. The structures can be configured to block resonant phonon emission around the qubit frequency leaving the low energy density of states unperturbed to maintain thermal conductivity at operating temperatures. Phononic meta-materials with bandgaps at a frequency of a few gigahertz (GHz) in quantum coherent superconducting devices (QCDs) are disclosed. These QCDs have an improved lifetime. PB structures may also be used in quantum dot and dopant based qubits.

The diagram of FIG. 1 depicts a schematic QCD 100 that confines energy to a space within a cavity with reflective ends 160. The confined energy may correspond to a resonant wave or particle such as wave 110. Defects in a material in which wave 110 propagates such as defect 170 causes a coupling of energy or a dissipation of energy shown at 150 from wave 110 to defect 170. 170 may couple energy back at 155 to wave 110 without resulting in a loss of energy to QCD 100. Phonon 170 may also couple energy at 175 via a phonon emission such as phonon emission 175 to the environment resulting in a loss of energy to QCD 100. The bandgap material disclosed herein reduces or prevents phonon emission 175 thereby preventing the loss of energy from wave 110 to the environment.

Figure 2:
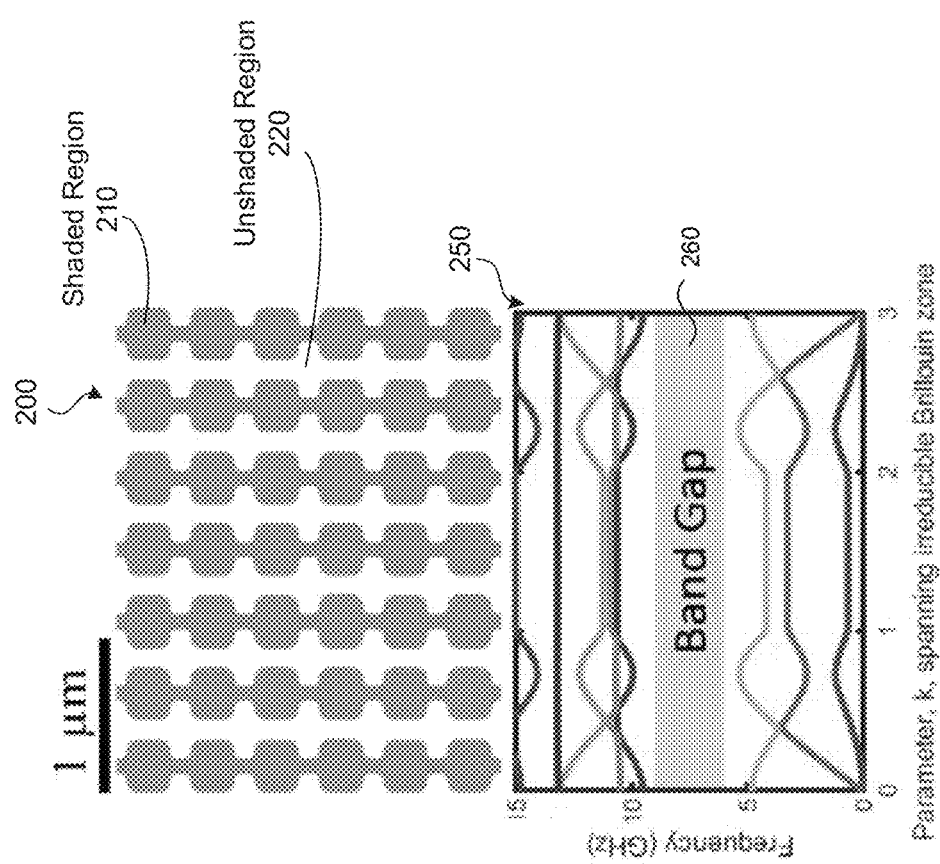
FIG. 2 depicts an example of a phononic bandgap structure and corresponding allowed phonon states, in accordance with some example embodiments.

FIG. 2 depicts a phononic bandgap structure 200 which exhibits a corresponding density of states 250. The phononic bandgap structure 200 in this example is a structure having a spatially repeating pattern represented by shaded regions 210 that are interleaved with unshaded regions 220 has size features on the order of 500 nanometers (nm). Other size features may be used as well with a range between about 200 nm and 5 microns. In this example, the shaded regions 210 and the unshaded regions 220 are spatially interleaved to form a repetitive pattern of crosses. In some example embodiments, the shaded regions 210 include a different material from the unshaded regions 220. For example, the shaded regions 210 may be patterned metal such as aluminum, lead, tin, niobium, or any other metal, or may be a ceramic such as titanium nitride, or other material capable of superconduction. In some example embodiments, the superconductivity of the material may be about 0.25 Kelvin, below which quantum devices with a frequency of 5 GHz may not function (the superconducting bandgap is comparable to $\hbar*\omega$, where $\hbar$ is the reduced Planck's constant, and $\omega$ is the angular frequency). In some example embodiments, the shaded regions 210 have a large acoustic impedance mismatch with unshaded regions 220. In these embodiments, the unshaded regions 220 include a substrate material. In other embodiments, the shaded regions 210 in the structure 200 correspond to substrate regions and the unshaded regions 220 correspond to etched voids in the substrate. Although FIG. 2 at 200 depicts a particular shape, various other repeating shapes may be used instead of the shape shown. The substrate may be silicon, or sapphire, or a combination of silicon and sapphire, a III-V material such as gallium arsenide, indium phosphide, gallium nitride, or other III-V material, or alumina or any other low-loss dielectric, or any other low-loss substrate material.

Shown at 250 is an example of plot of allowable frequencies in the phononic bandgap as a function of wavenumber. Phonon frequencies are allowed except in the bandgap region 260. The bandgap region corresponds to frequencies that do not propagate in the bandgap structure corresponding to phonon energies that cannot propagate or cause energy loss to the environment. When the disallowed phonon frequencies correspond to the oscillating frequency produced by the interaction of wave 110 with defects, the energy will be coupled back to the wave rather than coupled away to the environment. While the bandgap prohibits certain frequencies corresponding to energy loss via defects, the bandgap does not prohibit other phonon frequencies which can provide heat conduction.

Figure 3:
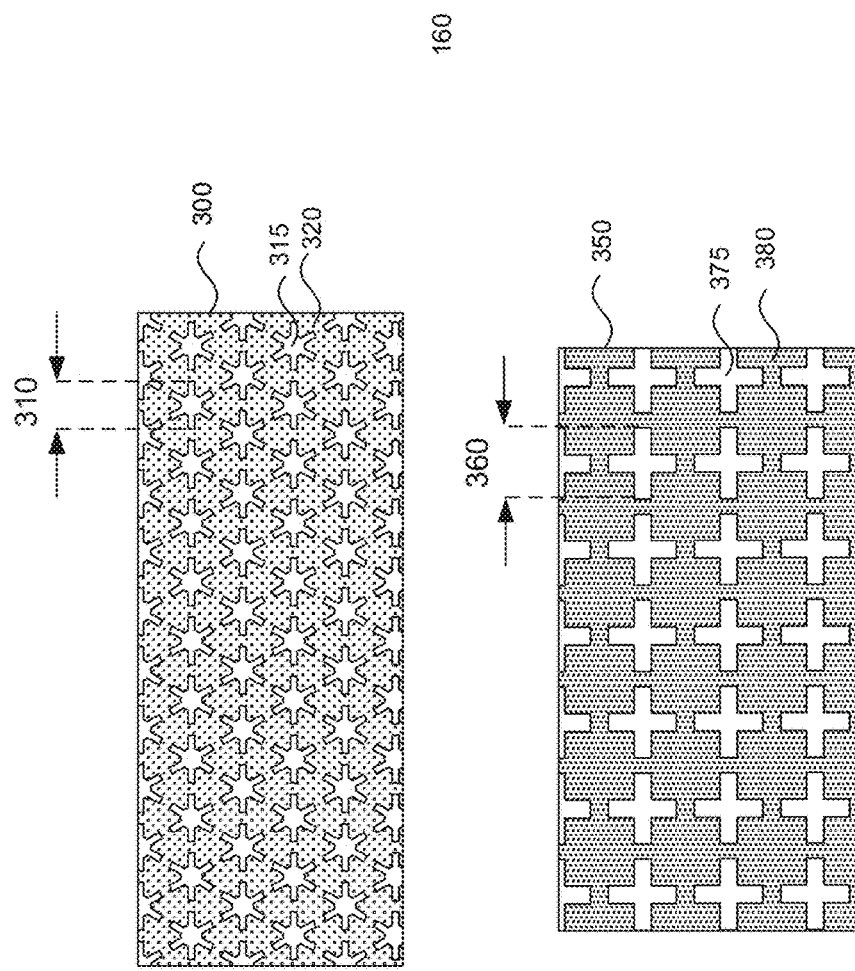
FIG. 3 depicts examples of repeating patterns for phononic bandgaps, in accordance with some example embodiments.

FIG. 3 depicts two additional examples 300 and 350 of repeating patterns of material to form structures exhibiting desired phononic bandgaps. In the structure 300, a "snowflake" pattern in an unshaded area 315 is formed by being surrounded by shaded regions 320 where the regions 315 and 320 may be formed by using two different materials. The size feature of the "snowflake" pattern 315 may be between about 200 nm and 5 microns, with a typical size of 500 nm. Accordingly, a dimension size 310 of each snowflake pattern 315 may have a length of between about 200 nm and 5 microns. In some embodiments, the shaded areas 320 may be a superconducting metal layer (further detailed above) on top of the unshaded area 315 which is a low-loss substrate (further detailed above). In other embodiments, the unshaded areas such as 315 may be voids in the substrate material under a superconducting metal layer (further detailed above). In some embodiments, the superconducting metal layer may be deposited onto a substrate layer and material may be removed according to the pattern via etching or other removal process.

The second example 350 in FIG. 3 is a "cross" pattern 375 similar to the pattern shown in FIG. 2. The size feature of the cross pattern may be between about 200 nm and 5 microns, with a typical size of 500 nm. Accordingly, an arm 360 may have a length of between about 200 nm and 5 microns. In some embodiments, the shaded areas such as 380 may be a superconducting metal layer (further detailed above) on top of the unshaded area 375 which is a low-loss substrate (further detailed above). In other embodiments, the unshaded areas such as 375 may be etched voids in the substrate material under the superconducting metal layer (further detailed above).

Figure 4:
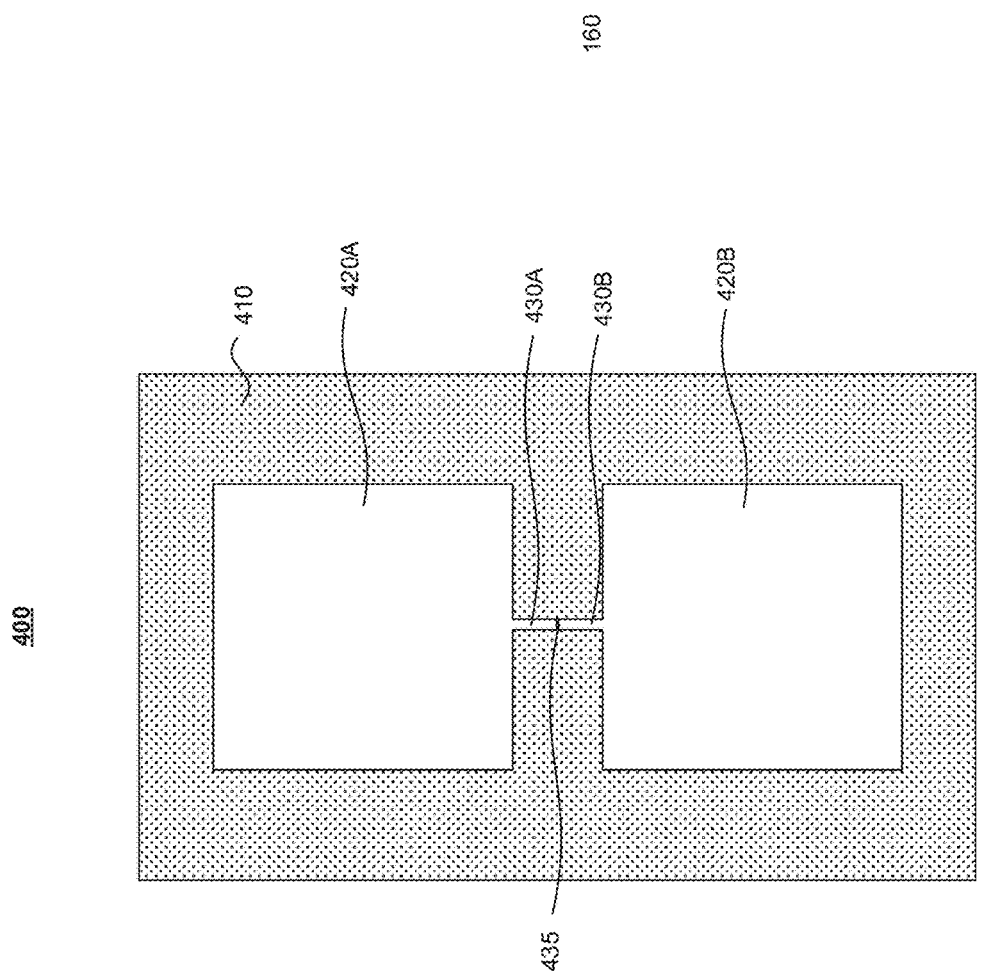
FIG. 4 depicts an example of a "hero-style" qubit, a quantum coherent device, in accordance with some example embodiments.

FIG. 4 depicts another example of a "hero-style" qubit 400, a quantum coherent device consistent with the disclosed subject matter. The qubit includes substrate 410, capacitor pads 420A and 420B formed of metal or electrically conductive pads, and inductive traces 430A and 430B connected by junction 435.

Substrate 410 may be any low-loss dielectric material as described above. In some example embodiments, substrate 410 may be patterned according to the patterns described above to create a phononic bandgap. For example, the substrate material may be etched away or removed using another technique leaving the pattern on the surface to a predetermined depth. Where the substrate is removed, another material may be in its place. For example, air or another dielectric material may replace the areas where the substrate is removed. Substrate material may be removed in either the "positive" image of the repeating shape of the "negative" image of the repeating shape (i.e., the "cross" shape areas are where the substrate is removed, or the substrate is removed leaving "cross" shaped substrate areas). In some example embodiments, the areas where the substrate is removed may be filled with a dielectric material that has a large acoustic impedance mismatch with the substrate. In other embodiments, the substrate may not be patterned at all.

Capacitor pads 420A and 420B comprise a superconducting metal as described above. In some example embodiments, the metal of capacitor pads 420A and 420B is patterned as described above to create a phononic bandgap. For example, a conductive layer may be deposited on top of substrate layer 410, the metal layer may be removed except for capacitor pads 420A and 420B, and inductive traces 430A and 430B. The metal of the capacitor pads 420A and 420B may be etched or otherwise removed to create the patterns described above, metal may be further removed or added to create a Josephson or tunneling junction between 430A and 430B. In other example embodiments, capacitor pads 420A and 420 B may not be patterned at all. In some example embodiments, both the substrate 410 and capacitor pads 420A and 420B may be patterned with the same or different patterns.

In some implementations, inductive traces 430A and 430B may include the same conductive material as capacitor pads 420A and 420B and may also be patterned as described above. The pattern may be the same or different from one or more of capacitor pads 420A and 420B and substrate 410. In some example embodiments, inductive traces 430A and 430B may not be patterned. Inductive traces 430A and 430B may be the same or different lengths. Inductive traces 430A and 430B may be connected via a tunnel junction or Josephson junction 435. In some example embodiments, a nanowire (not shown in FIG. 4) may replace inductive traces 430A and 430B and Josephson junction 435. The nanowire may be a thin wire connecting capacitor pads 420A and 420B. For example, a very thin layer (e.g., a single atom or a few atoms thick) may separate overlapping portions of inductive traces 430A and 430B. The inductance of inductive traces 430A and 430B may be due to a kinetic inductance of the superconducting inductive traces 430A and 430B. Tunnel junction or Josephson junction 435 is further detailed in FIG. 6.

Figure 5:
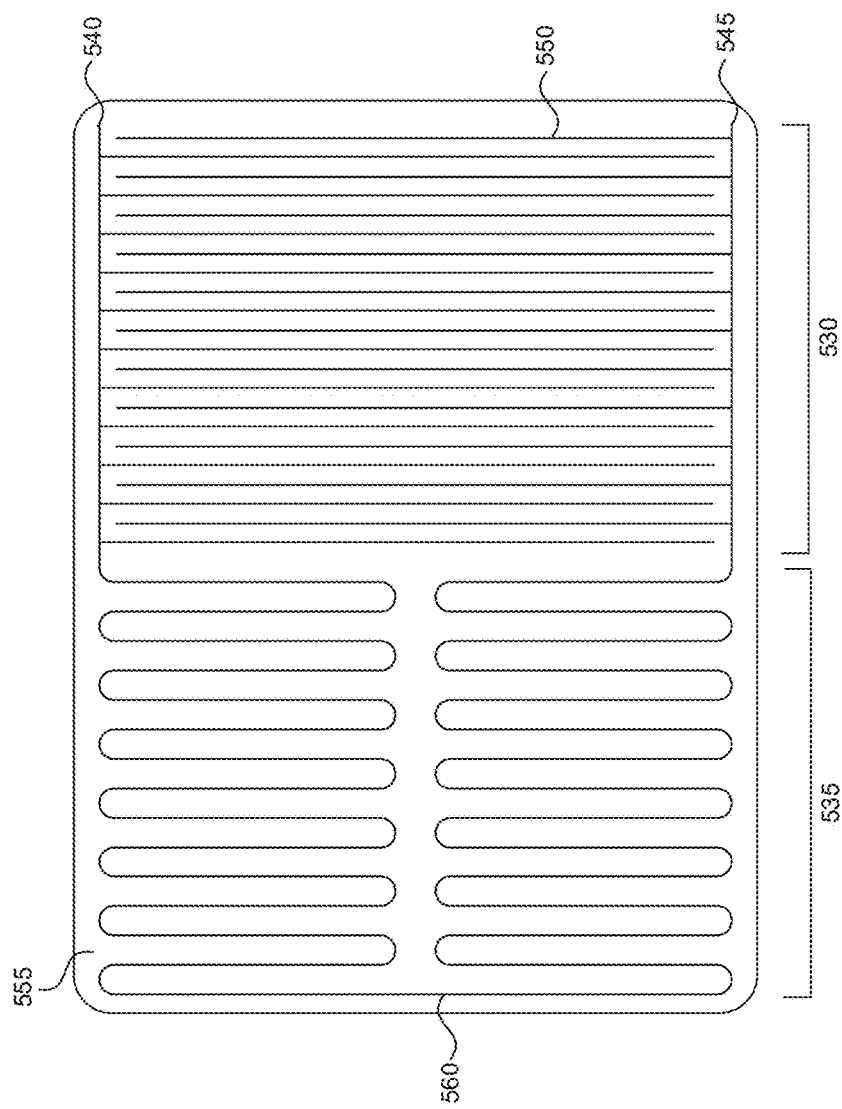
FIG. 5 depicts an example of a resonator, in accordance with some example embodiments.

FIG. 5 depicts an example of a resonator 500 that includes the disclosed subject matter. The example resonator 500 may be considered as a parallel inductor-capacitor tank circuit. The portion at 530 is an interdigital capacitor between the ports at 540 and 545 including trace 550. The portion 535 is a meander line inductor trace 560 between ports at 540 and 545. The metal traces of capacitor 530 and inductor 535 may be patterned on a substrate 555 as described above. In some example embodiments, the substrate is patterned as described above. Other resonators not shown in FIG. 5 may also use the disclosed subject matter. For example, a resonator may include a plate capacitor such as that shown in FIG. 4 instead of interdigital capacitor 530.

Figure 6:
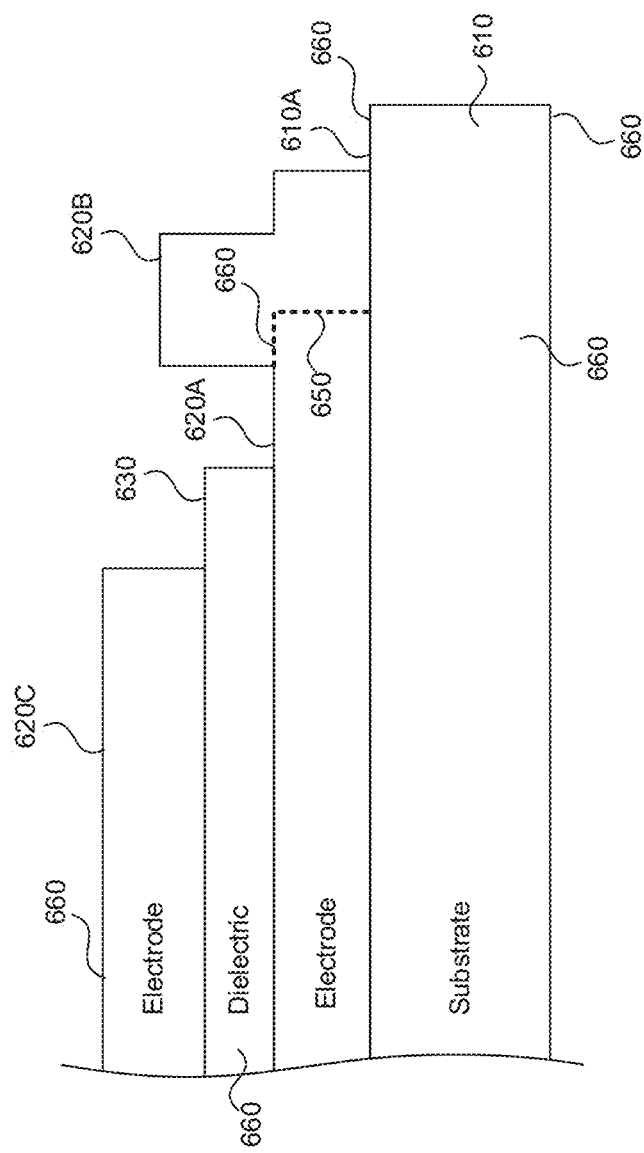
FIG. 6 depicts a cross-sectional view of a substrate with a dielectric and electrode layers and an example of a Josephson junction, in accordance with some example embodiments.

FIG. 6 depicts an example cross-sectional view of a substrate with dielectric and electrode layers and an example of a Josephson junction. Substrate 610 is a low-loss substrate that is patterned on its top surface 610A. Above substrate 610 is electrode layer 620A which may be a patterned metal layer as described above. Thin dielectric layer 650 separates electrode layer 620A from 620B. Thin dielectric layer 650 may be a layer of oxide as thin as one molecular layer or may be several molecular layers. For example, when electrode layers 620A and 620B are aluminum, dielectric layer 650 may be an aluminum oxide layer one molecule thick.

Dielectric layer 650 may form a Josephson junction or a tunneling junction. Note that dielectric layer 650 is too small to be seen in FIG. 4.

FIG. 6 also shows an example in which areas having defects may cause the energy loss due to phonon relaxation which is reduced or eliminated by the phononic bandgap. Defects 660 occur at interfaces such as electrode-air interfaces and substrate-electrode interfaces, and may occur in the dielectric layer 630 and thin dielectric layer 650. Defects may cause more energy loss due to phonon relaxation in areas where high electric fields are present such as across thin dielectric layers 650 and 630 as well as the surfaces of superconducting electrodes.

Figure 7:
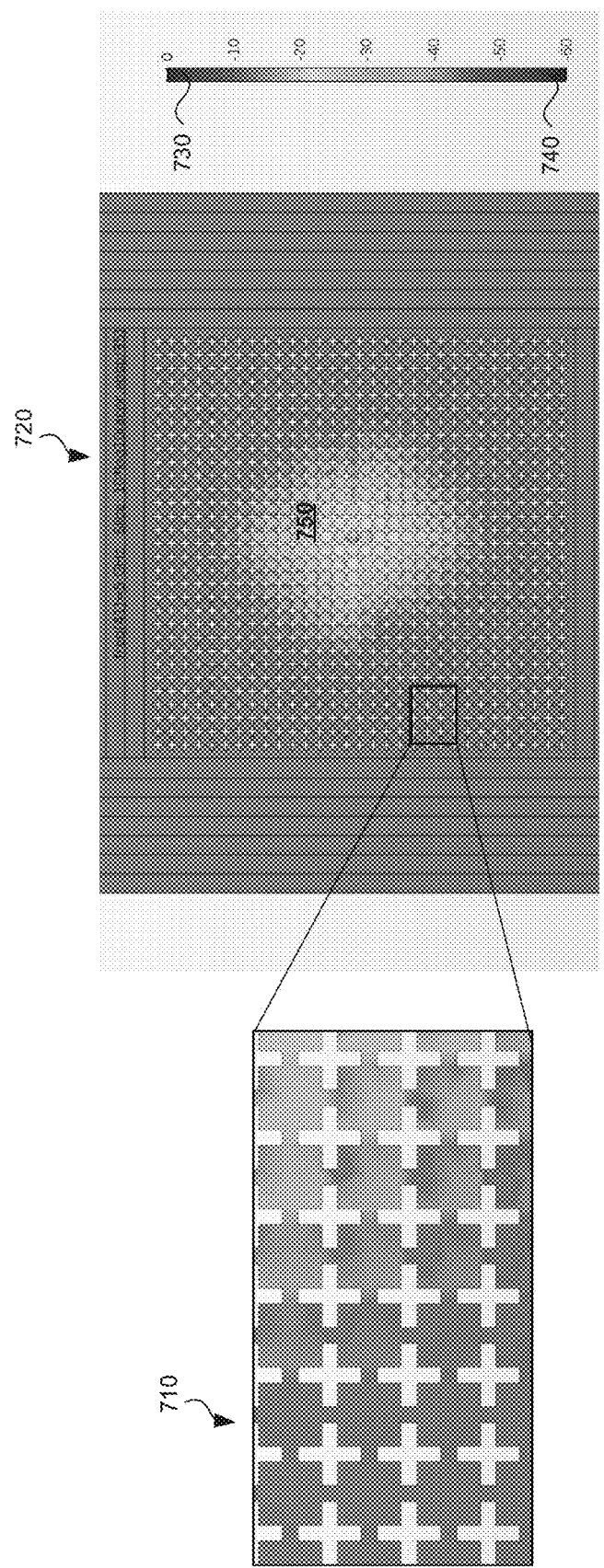
FIG. 7 depicts an example of a simulation plot showing the suppression of phonon emission, and thus energy loss due to a defect, in accordance with some example embodiments.

FIG. 7 depicts an example of a simulation plot showing the suppression of phonon emission, and thus energy loss due to a defect. A structure 720 is designed to have a phononic bandgap including the "cross" shaped pattern 710 described above. The plot on the right-hand side shows suppression of phonon emission from a defect 750 and has a scale between 0 dB at 730 and −60 dB at 740 with graded color-coding according to the scale with two opposite ends 730 and 740. At the center of the structure 720, where defect 750 is located, there is little attenuation of the phonon emissions. Moving out radially, at approximately 2 unit cells of the cross pattern from the defect location 750, the attenuation increases to 20 dB below the emission at 750 (i.e., a level of −20 dB compared to the defect location 750). At about 5 unit cells from the defect location, the emissions are at about −40 dB compared to the defect location, and at about 10 unit cells the emissions are about −60 dB compared to the defect location. The plot shows increasing suppression of phonon emissions as the distance increases from the defect location which is the result of the phononic bandgap.

Figure 8:
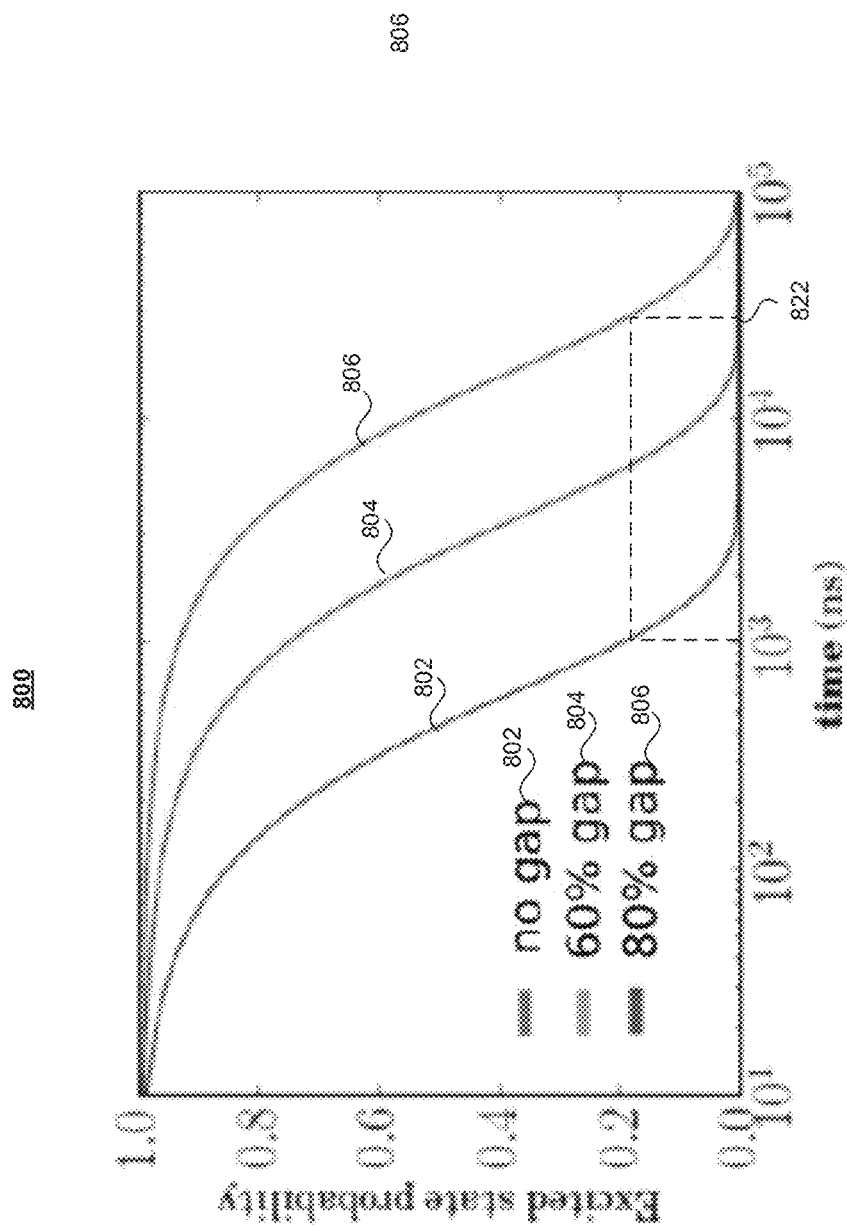
FIG. 8 depicts example simulation results showing quantum coherent device lifetime as a function the effectiveness of the phononic bandgap, in accordance with some example embodiments.

FIG. 8 depicts simulation results showing QCD lifetime as a function the effectiveness of the phononic bandgap. The plot corresponds to a simulation of a transmon as a two-level system (TLS) interacting with the phonon bath. Even a non-ideal bandgap centered at the TLS frequency will always result in a reduction of the decay rate of the TLS. FIG. 8. shows solutions of the ME for no bandgap at 802, a bandgap with 60% suppression at 804, and a bandgap with 80% suppression at 806. The plot corresponds to a transmon with an intrinsic (ungapped) lifetime of 1 microsecond (812) coupled to a phonon bath with a 1 GHz bandgap centered on resonance. A gap with an 80% suppression of the TLS phonon interaction strength extends the lifetime of this transmon by over an order of magnitude to approximately 30 microseconds (822).

Figure 9:
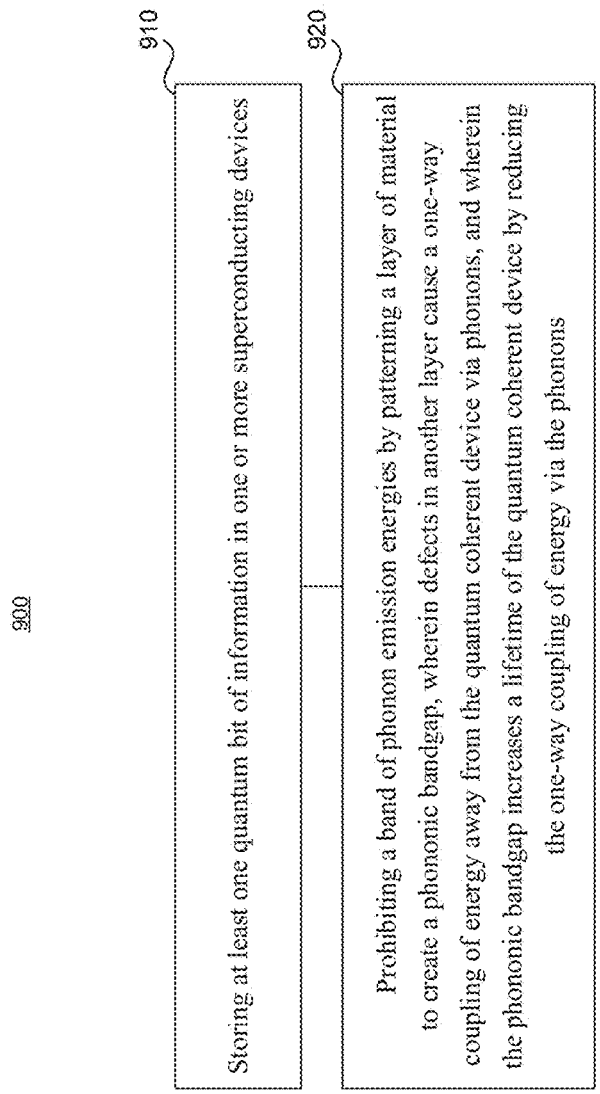
FIG. 9 depicts a process for extending the lifetime of a quantum coherent device, in accordance with some example embodiments.

FIG. 9 depicts a process for extending the lifetime of a quantum coherent device. The method includes at 910 storing energy in one or more superconducting devices such as the devices described with respect to FIGS. 1-8. The method further includes at 920 prohibiting a band of phonon emission energies by patterning a layer of material to create a phononic bandgap as described above with respect to FIGS. 1-8. Defects layer cause a one-way coupling of energy away from the quantum coherent device via phonons. The phononic bandgap increases a lifetime of the quantum coherent device by reducing the one-way coupling of energy via the phonons as described above with respect to FIGS. 1-8.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the process flow depicted in the accompanying figures and/or described herein does not require the particular order shown, or sequential order, to achieve desirable results. Other embodiments may be within the scope of the following claims.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A quantum coherent apparatus comprising:
   one or more superconducting devices structured to exhibit different quantum states for quantum computing, each superconducting device including
   a plurality of layers comprising
   a patterned layer structured to exhibit a phononic bandgap; and
   another layer coupled to the patterned layer, wherein a defect in the plurality of layers causes a one-way coupling of energy away from the quantum coherent apparatus via phonons excited within the phononic bandgap so that the phononic bandgap increases a lifetime of the quantum coherent device by reducing the one-way coupling of energy via the phonons.

2. The quantum coherent apparatus of claim 1, wherein the patterned layer causes forbidden phonon energy states corresponding to a predetermined frequency to reduce the one-way coupling of energy via the phonons.

3. The quantum coherent apparatus of claim 1, wherein the one or more superconducting devices are patterned to reduce the one-way coupling of energy via the phonons.

4. The quantum coherent apparatus of claim 1, wherein the patterned layer is a dielectric layer.

5. The quantum coherent apparatus of claim 1, wherein the patterned layer is a substrate layer.

6. The quantum coherent apparatus of claim 1, wherein the patterned layer is a ground plane layer.

7. The quantum coherent apparatus of claim 1, wherein the one or more superconducting devices comprise two superconducting devices.

8. The quantum coherent apparatus of claim 7, wherein the two superconducting devices are connected together via a Josephson junction.

9. The quantum coherent apparatus of claim 1, wherein the other layer includes a dielectric layer which includes the defects.

10. The quantum coherent apparatus of claim 7, wherein the defects are present on a surface on the superconducting devices, a surface of the substrate, or a surface of a metal layer.

11. The quantum coherent apparatus of claim 1, wherein the plurality of layers is structured to enable the energy from the phonons to be coupled back to the one or more superconducting devices.

12. The quantum coherent apparatus of claim 1, wherein the quantum coherent apparatus is configured as a resonator.

13. The quantum coherent apparatus of claim 1, wherein the patterned layer is patterned to include repeating geometric shapes.

14. The quantum coherent apparatus of claim 13, wherein the repeating geometric shape includes a star.

15. The quantum coherent apparatus of claim 13, wherein the repeating geometric shape includes a cross.

16. The quantum coherent apparatus of claim 1, wherein the repeating geometric shape has a size between 200 nanometers and 5 microns.

17. The quantum coherent apparatus of claim 11, wherein the quantum coherent apparatus is configured as a qubit comprising a transmon or an xmon.

18. A method of extending the lifetime of a quantum coherent device, the method comprising:
storing energy in one or more superconducting devices; and
prohibiting a band of phonon emission energies by patterning a layer of material to create a phononic bandgap to cause a one-way coupling of energy away from the quantum coherent device via phonons, wherein the phononic bandgap increases a lifetime of the quantum coherent device by reducing the one-way coupling of energy via the phonons.

19. The method of claim 18, wherein:
the layer includes one or more of a dielectric layer, a substrate layer, and a ground plane layer; and
the other layer includes one or more of a dielectric layer, a substrate layer, and a metal plane layer.

20. The method of claim 18, comprising:
structuring the one or more superconducting devices to include two superconducting devices that are connected together via a Josephson junction.

21. The method of claim 18, comprising structuring the quantum coherent device as a resonator.

22. The method of claim 18, comprising configuring the quantum coherent device to store at least one quantum bit of information as part of the stored energy.

* * * * *